US008773181B2

(12) United States Patent
Mcleod et al.

(10) Patent No.: US 8,773,181 B2
(45) Date of Patent: Jul. 8, 2014

(54) LOCKED LOOP CIRCUITS AND METHODS

(71) Applicant: Cambridge Silicon Radio Limited, Cambridge (GB)

(72) Inventors: Duncan Mcleod, Cambridge (GB); Farshid Nowshadi, Harston (GB); David Chappaz, Cambridge (GB)

(73) Assignee: Cambridge Silicon Radio, Ltd., Cambridge (GB)

( * ) Notice: Subject to any disclaimer, the term of this patent is extended or adjusted under 35 U.S.C. 154(b) by 0 days.

(21) Appl. No.: 13/691,650

(22) Filed: Nov. 30, 2012

(65) Prior Publication Data

US 2014/0152359 A1 Jun. 5, 2014

(51) Int. Cl.
*H03L 7/06* (2006.01)

(52) U.S. Cl.
USPC ............ 327/156; 327/158; 327/159; 331/18; 375/376

(58) Field of Classification Search
USPC ................ 327/147, 149, 150, 156, 158, 159; 331/18; 375/376
See application file for complete search history.

(56) References Cited

U.S. PATENT DOCUMENTS

| 4,636,747 | A | 1/1987 | Selim |
| 8,373,464 | B2 * | 2/2013 | Sornin .......................... 327/156 |
| 8,610,508 | B2 * | 12/2013 | Sornin ............................. 331/18 |
| 2009/0033376 | A1 | 2/2009 | Lesso |
| 2010/0301961 | A1 | 12/2010 | Story et al. |
| 2010/0321075 | A1 | 12/2010 | Lamanna et al. |
| 2011/0012652 | A1 | 1/2011 | Lamanna et al. |
| 2011/0019767 | A1 | 1/2011 | Lamanna et al. |
| 2011/0025386 | A1 | 2/2011 | Lamanna et al. |
| 2011/0025387 | A1 | 2/2011 | Lamanna et al. |
| 2011/0025388 | A1 | 2/2011 | Lamanna et al. |
| 2011/0204938 | A1 | 8/2011 | Lamanna et al. |
| 2012/0074990 | A1 | 3/2012 | Sornin |
| 2012/0098578 | A1 | 4/2012 | Newton et al. |
| 2012/0105120 | A1 | 5/2012 | Sornin |

FOREIGN PATENT DOCUMENTS

| EP | 047142 | 6/1998 |
| GB | 2469473 | 10/2010 |

OTHER PUBLICATIONS

Search Report issued Feb. 21, 2014 in corresponding EP13170004.8.

* cited by examiner

*Primary Examiner* — Patrick O'Neill
(74) *Attorney, Agent, or Firm* — Pillsbury Winthrop Shaw Pittman LLP

(57) ABSTRACT

The present invention provides a locked loop circuit in which the input clock signal is delayed according to a saw-tooth signal in order to output a range of frequencies not necessarily equal to an integer multiple of the input clock signal. The absolute value of the delay (i.e. the difference between the maximum and minimum values of the saw-tooth delay) can be calibrated by detecting the value of the circuit phase detector at the wrap point of the saw-tooth.

12 Claims, 3 Drawing Sheets

LOCKED LOOP CIRCUITS AND METHODS

TECHNICAL FIELD

The present invention relates to locked loop circuits, and particularly to phase locked loop circuits and methods for controlling phase locked loop circuits.

BACKGROUND

A phase locked loop (PLL) is a well known circuit for generating signals having a predetermined frequency relationship with a reference signal. In its most basic form, a PLL comprises an oscillator that is controlled by means of a feedback loop. The feedback loop takes the output of the oscillator, compares it to the reference signal and adjusts the oscillator accordingly. The PLL may comprise a phase comparator for comparing the phase of the output signal with that of the reference signal, and a control means, such as a charge pump, for outputting a signal which either increases or decreases the frequency of the oscillator in dependence on the comparison. A low-pass filter can be used to suppress spurious noise created by the control means before it reaches the oscillator.

The feedback loop may also comprise a divider for dividing the output signal before it reaches the phase comparator, and in this way the PLL can be controlled to generate signals having frequencies which are integer multiples of the reference signal frequency. Some PLLs are able to generate output signals which are non-integer multiples of the reference signal frequency by applying a non-integer divider in the feedback loop. For example, a sigma-delta circuit can be used in the feedback loop to apply varying integers which nonetheless average to the required fraction. One example of a frequency locked loop (FLL) according to this type is shown in US patent publication no 2009/0033376.

However, the divider in such PLLs (whether integer or fractional) tends to be power hungry, and therefore they are not suitable for all applications. An alternative method of generating signals is required.

SUMMARY OF INVENTION

According to an aspect of the present invention, there is provided a locked loop circuit, comprising: a delay cell for receiving a clock signal, applying a delay in accordance with a saw-tooth pattern and outputting a delayed clock signal; a comparator for comparing the phase of the delayed clock signal and the phase of an output signal, and outputting a comparison signal; an integrator for integrating the comparison signal and outputting an integrated signal; an oscillator for generating the output signal as controlled by the integrated signal; and feedback circuitry for measuring the comparison signal at a wrap point of the saw-tooth pattern and controlling the amplitude of the saw-tooth pattern in dependence on the measured comparison signal.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

Figure 1:
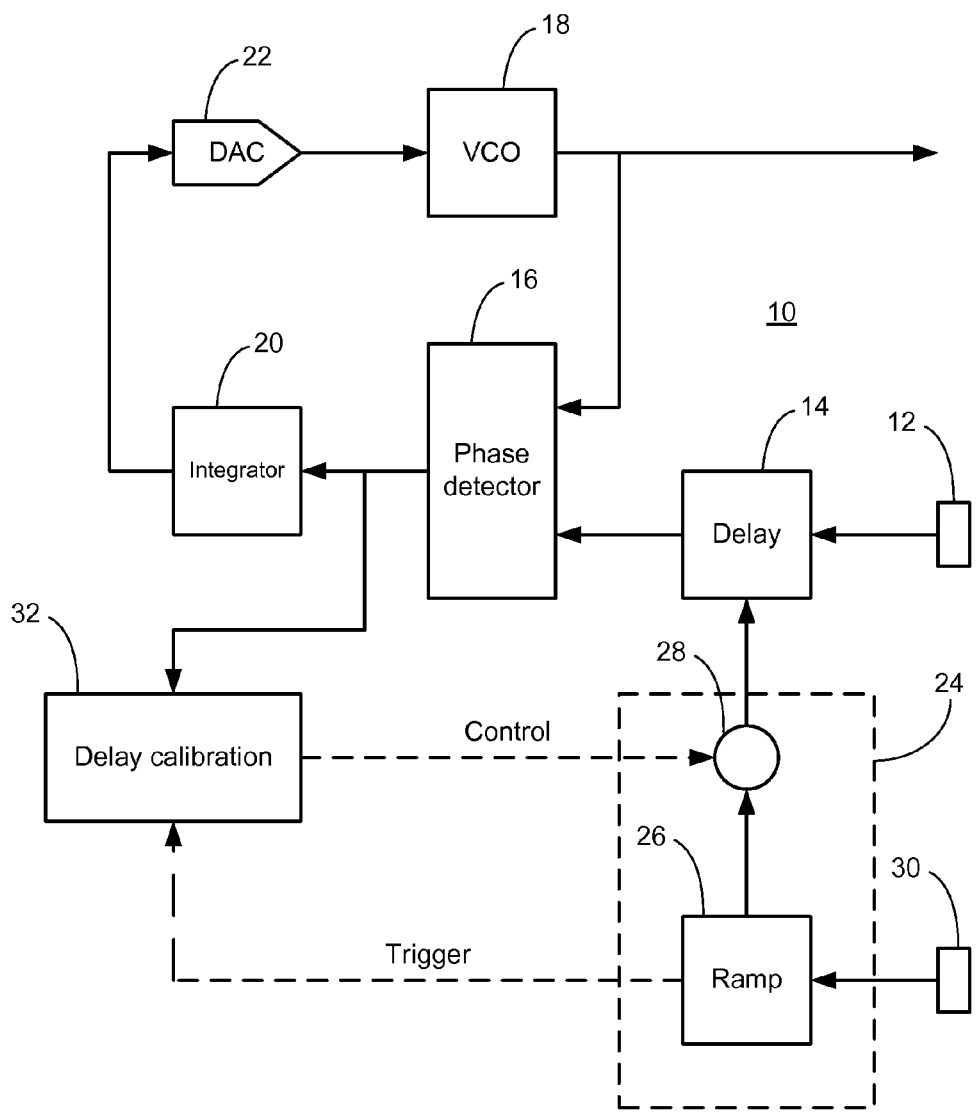
FIG. 1 shows a locked loop circuit in accordance with embodiments of the present invention.

FIG. 1 illustrates a locked loop circuit 10 in accordance with embodiments of the present invention.

The circuit 10 comprises an input 12 for receiving a clock signal. The clock signal is applied to a delay cell 14, and the delayed clock signal is output to a phase comparator 16. The operation of the delay cell 14 will be described in greater detail below. A voltage-controlled oscillator (VCO) 18 generates an output signal having a frequency and a phase, and this signal is also provided to the phase comparator 16.

The phase comparator 16 compares the phase of the output signal and the delayed clock signal, and outputs a comparison signal which represents the difference in phase of the two signals. For example, the comparison signal may have a voltage amplitude which is related to the phase difference. The comparison signal is passed to an integrator 20 which integrates it and generates a control signal. The integrator 20 can be any circuitry which integrates an incoming signal as would be understood by those skilled in the art. For example, the integrator 20 may comprise a digital loop filter. The control signal is then converted to analogue by a digital-to-analogue converter (DAC) 22, and the analogue control signal used to control the frequency of the VCO 18.

It will be apparent to those skilled in the art that the components described above correspond largely to a conventional digital phase-locked loop circuit. That is, the action of the loop is to lock the frequency and phase of the output signal generated by the VCO 18 to that of the delayed clock signal or, more typically, to an integer multiple of the frequency of the delayed clock signal.

However, it is desirable for the circuit to output a range of frequencies, and particularly for the circuit to output frequencies which are non-integer multiples of the clock signal. The manner in which the circuit 10 can be controlled to output such frequencies will be described below.

If the clock signal has a constant frequency and the delay applied by the delay cell 14 is also constant, under steady state conditions the phase comparator 16 consistently samples the VCO output signal at the same phase. The frequency and phase of the output signal therefore matches that of the delayed clock signal (or in practice an integer multiple of the delayed clock signal).

If the delay applied to the clock signal is incremented between sampling points, however, there will be a phase difference Δφ between the delayed clock signal and the VCO output signal corresponding to the delay increment in that sampling period. The action of the phase-locked loop is then to counteract that difference in phase, and the frequency of the VCO output signal is adapted accordingly. If the delay for subsequent periods remains at the same incremented value, the VCO output signal will ultimately revert to its original frequency, and lock to the phase of the slightly delayed clock signal. If the delay applied to the clock signal is incremented at each sampling, point, however, the frequency of the VCO output signal is consistently altered so as to counteract the incremental phase differences applied by the delay cell 14. The frequency of the output signal is no longer an integer multiple of the clock signal, but is adjusted from the integer multiple by action of the incremental phase shift applied by the delay cell 14 at each sampling point. By controlling the magnitude of the delay increment applied at each sampling point, the phase-locked loop circuit 10 can be controlled to output a signal whose frequency can take a range of values below integer multiples of the clock frequency. That is, the output frequency is decreased relative to the integer multiple of the clock frequency.

Although described above with respect to an incrementing delay, it will be apparent to those skilled in the art that by decrementing the delay at successive sampling points, the frequency of the VCO output signal can be controlled to take a range of values above integer multiples of the clock frequency. That is, the output frequency is increased relative to the integer multiple of the clock frequency. The delay cell 14 can therefore be controlled so as to alter the frequency of the VCO output signal.

For example, suppose the frequency of the VCO output signal is n times greater than the frequency of the clock signal, where n is an integer equal to or greater than one. Therefore in the locked state, for each sampling period, $$nT_v = T_c,$$

where $T_v$ is the period of the VCO output signal and $T_c$ is the period of the clock signal.

If the clock signal is delayed by an amount dτ in each sampling period, as described above, then in the locked state $$nT_v = T_c + \Delta\tau$$

$$T_v = \frac{T_c + \Delta\tau}{n}$$

That is, the period of the VCO output signal is adapted to take a different value, greater if $\Delta\tau$ is positive (leading to a lower frequency), smaller if $\Delta\tau$ is negative (leading to a higher frequency). The magnitude of $\Delta\tau$ controls the change in frequency.

Of course, it is not practicable to increment or decrement the delay applied by the delay cell 14 indefinitely. The delay cell 14 has a finite capacity and eventually the delay must "wrap" to its starting value. For example, in one embodiment, the value of the delay begins at a minimum value (which may be zero), increases in steps, reaches a maximum value, and then jumps back to the minimum value. In other embodiments, the value of the delay begins at a maximum value, decreases in steps, reaches a minimum value (which may be zero), and then jumps back to the maximum value. In either case, this waveform can be described more generally as a saw-tooth pattern.

The circuit 10 therefore further comprises a saw-tooth generator 24 which generates a signal having a saw-tooth pattern and provides that signal to the delay cell 14 such that the delay applied by the cell 14 varies in a saw-tooth pattern as described above. Various means for achieving the saw-tooth delay will be apparent to those skilled in the art, and the invention is not limited to any particular means unless so defined in the independent claims appended hereto.

In the illustrated embodiment, the saw-tooth generator 24 comprises a ramp signal generator 26, which generates a ramp signal, and a gain element 28 which applies a gain to the ramp signal. The value of the ramp signal increases or decreases incrementally before wrapping to its original starting value. For example the ramp generator may comprise a multi-bit register, the value of which increases or decreases in increments until the value of the binary value stored in the register wraps to zero and then the process repeats.

The value of the increment controls the change in frequency of the VCO output signal (cf the equations set out above); this can be set as a constant value (if the VCO is to output a constant signal), or controlled via a further input 30.

In one embodiment, the input 30 provides a control signal to the ramp generator 26 to set the value of the increment. The input 30 may receive one or more data streams, modulating the control signal and therefore the frequency of the VCO output signal according to that data. In this way the circuit 10 can be used to generate an output signal whose frequency is modulated according to one or more input data streams.

To operate correctly, it can be seen that the absolute time delay applied by the delay cell 14 needs to be calibrated such that when the delay cell 14 wraps the change in delay is equal to one or an integer multiple of the period of the VCO output signal. A single period of the VCO output signal is preferred, however, else the delay cell 14 becomes longer and more difficult to design.

Figure 2:
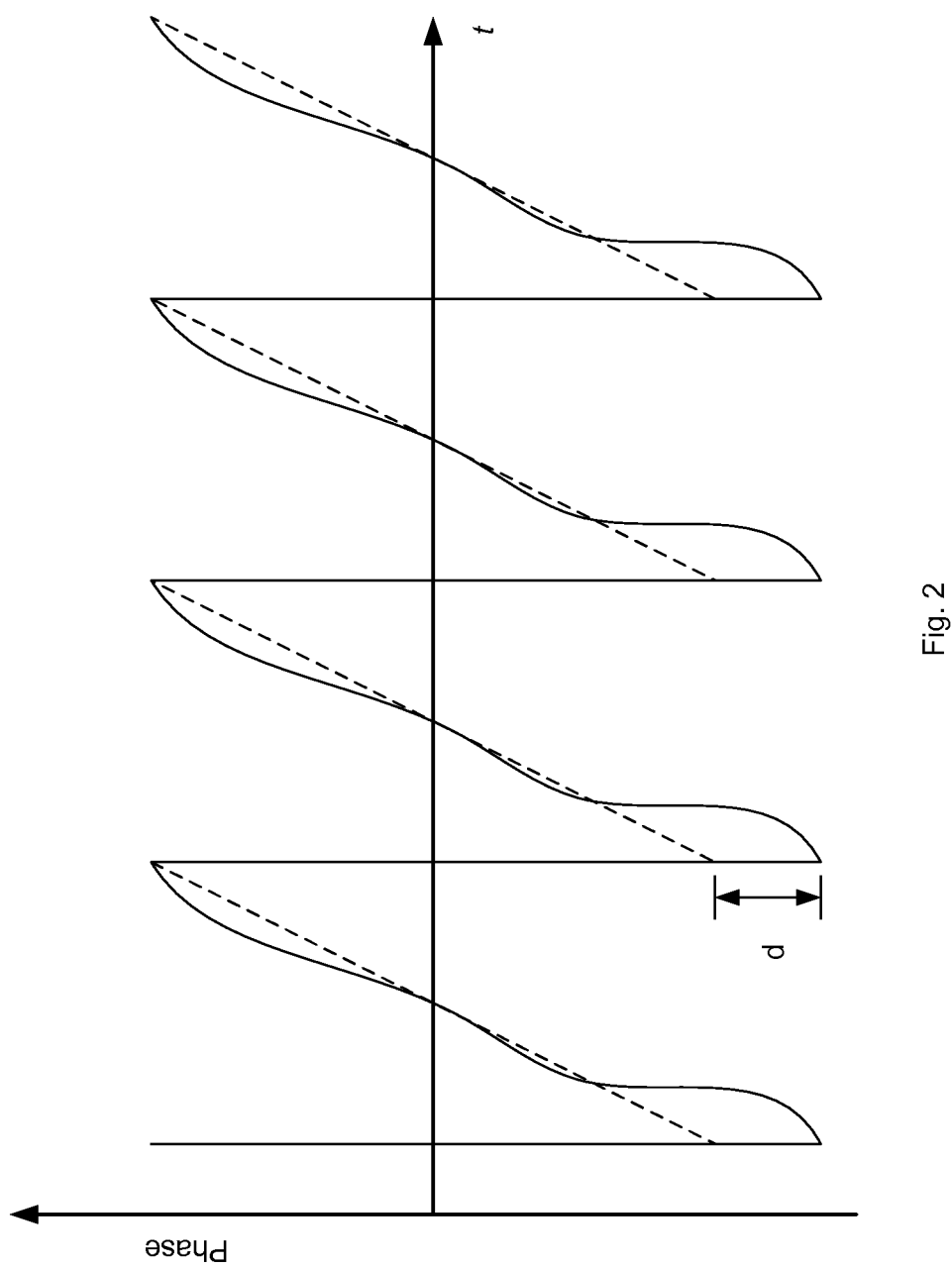
FIG. 2 is a schematic diagram showing the relationship of the saw-tooth signal and the output of the phase comparator.

FIG. 2 is a graph showing the relationship between the phase of the saw-tooth signal provided to the delay cell 14 (dashed line) and the output of the phase comparator 16 (solid line). In the illustrated embodiment, the saw-tooth signal provided to the delay cell increments gradually from a minimum value to a maximum value before wrapping, but it should be clear to those skilled in the art that the signal might equally decrement from a maximum value to a minimum value before wrapping.

The graph shows the situation where the absolute delay applied by the delay cell 14 is not correctly calibrated. It can be seen that the output of the phase comparator 16 closely follows the saw-tooth signal, and this is to be expected when the loop is locked. There are slight differences over the course of each ramp cycle (due to many factors), but overall the two traces are close to each other.

At the start of each ramp cycle (i.e. immediately after the wrapping point), however, the output of the phase comparator 16 is significantly different from the ramp signal. The output of the phase comparator 16 overshoots the ramp signal by some value. This is because the absolute magnitude of the ramp signal (i.e. the difference between the maximum value and the minimum value) is not equal to an integer number of periods. Therefore when the value of the ramp signal wraps, and thus the value of the delay wraps, the output of the delay cell jumps in phase relative to the VCO output signal.

The effect of an incorrectly calibrated delay amplitude is to introduce spurii into the output spectrum of the VCO 18, which can compromise the overall performance of any system in which the circuit 10 is connected. It is therefore important that the amplitude of the delay line is correctly calibrated at all times. Moreover, the calibration should preferably be dynamic to account for the nature of the analogue components in the delay cell 14, temperature drift and process variations, all of which have an effect on the absolute delay over time.

The inventors have noted the correlation of the output of the saw-tooth generator 24 and the output of the phase detector 16 at the wrap point of the saw-tooth signal (and thus the delay). In particular, the difference between the output of the phase detector 16 and the saw-tooth signal (marked d on FIG. 2) is monotonically related to the amplitude error. This correlation can be employed, using diverse methods, to servo the amplitude of the saw-tooth signal to take an optimum value such that the value of d is reduced to a minimum and, preferably, to zero.

According to embodiments of the present invention, therefore, the circuit 10 further comprises a servo loop connected between the output of the phase detector 16 and the gain element 28. The servo loop comprises a delay calibration block 32 which detects the output of the phase detector 16 at the wrap point of the delay cell 14, and uses that information to calibrate the absolute magnitude of the delay by adjusting the gain which is applied in the gain element 28.

Figure 3:
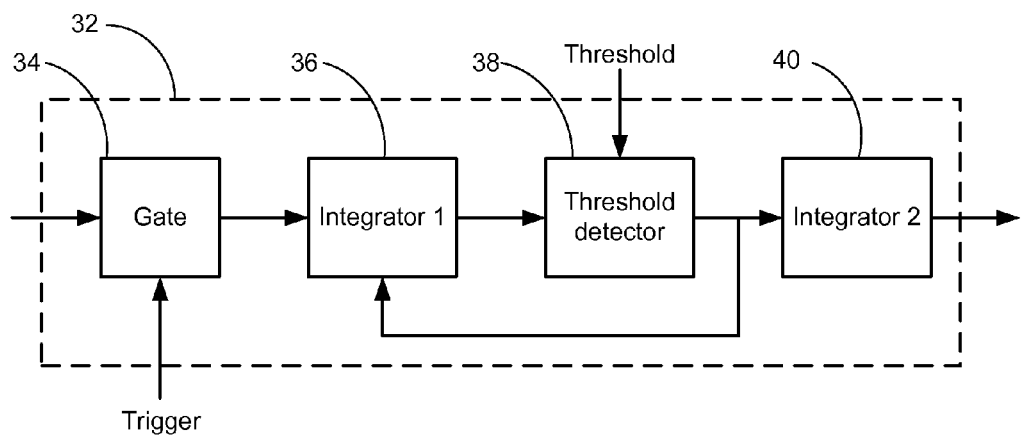
FIG. 3 is a schematic diagram of a servo loop according to embodiments of the present invention.

FIG. 3 shows a delay calibration block 32 according to some embodiments of the present invention.

The block 32 comprises a gate 34 which receives the output of the phase detector 16 and a trigger signal. When the delay cell 14 or the saw-tooth signal wraps, the trigger signal controls the gate 34 to gate the output of the phase detector 16. In one embodiment, the output of the phase detector 16 is gated at the first available sampling point after the wrapping point. The trigger signal may be received from the saw-tooth generator 24 (as illustrated), or generated by the calibration block 32 itself on the basis of the saw-tooth signal.

The output of the gate 34 is fed to a first integrator 36 (integrator 1), which integrates the signal over multiple clock cycles. Those skilled in the art will appreciate that various circuits can be employed in this manner to integrate a signal.

The output of the first integrator 36 is fed to a threshold detector 38, or comparator, which compares the integrated signal to upper and lower threshold values. In one embodiment the upper and lower threshold values are symmetrically arranged around a target value. In an embodiment where the target value is zero, the upper and lower threshold values are symmetrically positive and negative respectively.

When the integrated signal reaches a threshold, the detector 38 outputs a control signal to a second integrator 40. For example, when the integrated signal reaches an upper or lower threshold value, the detector 38 may output a increment/decrement signal as appropriate, instructing the second integrator 40 to increment or decrement its value. The detector 38 also generates a clear signal for the first integrator 36, to restart the first integrator 36 at zero.

The output of the second integrator 40 is then used to control the value of the gain applied in the gain element 28 (and therefore the absolute amplitude of the delay applied in the delay cell 14).

The embodiment described with respect to FIG. 3 allows the calibration to occur at a rate (through appropriate setting of the upper and lower thresholds) such that the delay can be adjusted as necessary to account for temperature variations, etc, but without introducing spurii of its own through excessively rapid changes. However, it will be apparent to those skilled in the art that various means may be used to control the absolute value of the delay based on the value of the phase detector output at the wrap point, without departing from the scope of the invention.

The delay calibration block 32 can be arranged to sample the output of the phase detector 16 at each wrap point in order to calibrate the absolute delay continuously throughout use of the circuit 10. However, in order to save energy, the calibration block 32 may be arranged to sample the phase detector output at only a subset of the wrap points (e.g. every other wrap point, or once every x wrap points, where x is an integer equal to or greater than 1). In further alternative embodiments, the delay calibration block 32 may be employed only at certain defined instances (e.g. at start up) to calibrate the absolute delay, or activated periodically to update the calibration of the absolute delay as necessary.

The present invention therefore provides a locked loop circuit in which the input clock signal is delayed according to a saw-tooth signal in order to output a range of frequencies not necessarily equal to an integer multiple of the input clock signal. The absolute value of the delay (i.e. the difference between the maximum and minimum values of the saw-tooth delay) can be calibrated by detecting the value of the circuit phase detector at the wrap point of the saw-tooth.

Those skilled in the art will appreciate that various amendments and alterations can be made to the embodiments described above without departing from the scope of the invention as defined in the claims appended hereto.

What is claimed is:

1. A locked loop circuit, comprising:
   a delay cell for receiving a clock signal, applying a delay in accordance with a saw-tooth pattern and outputting a delayed clock signal;
   a comparator for comparing the phase of the delayed clock signal and the phase of an output signal, and outputting a comparison signal;
   an integrator for integrating the comparison signal and outputting an integrated signal;
   an oscillator for generating the output signal as controlled by the integrated signal; and
   feedback circuitry for measuring the comparison signal at a wrap point of the saw-tooth pattern and controlling the amplitude of the saw-tooth pattern in dependence on the measured comparison signal.

2. The locked loop circuit according to claim 1, wherein the saw-tooth pattern comprises repeated cycles of sequentially incrementing or decrementing delay values followed by a wrap point.

3. The locked loop circuit according to claim 1, wherein the delay is incremented for successive transitions of the clock signal between a minimum delay value and a maximum delay value followed by a wrap point to the minimum delay value, or decremented for successive transitions of the clock signal between a maximum delay value and a minimum delay value followed by a wrap point to the maximum delay value.

4. The locked loop circuit according to claim 3, further comprising a controller for controlling the magnitude of the delay increment or decrement between successive transitions in order to control the frequency of the output signal relative to the frequency of the clock signal.

5. The locked loop circuit according to claim 4, further comprising an input for receiving an input signal, wherein the controller is configured to control the magnitude of the delay increment or decrement in dependence on the input signal in order to modulate the output signal.

6. The locked loop circuit according to claim 3, wherein the amplitude of the saw-tooth pattern corresponds to the difference between the minimum delay value and the maximum delay value.

7. The locked loop circuit according to claim 1, wherein the feedback circuitry is configured to control the amplitude of the saw-tooth pattern so as to minimize the value of the comparison signal at the wrap point.

8. The locked loop circuit according to claim 7, wherein the amplitude of the saw-tooth pattern is controlled so as to equal a period of the output signal.

9. The locked loop circuit according to claim 1, further comprising a saw-tooth generator for generating a saw-tooth signal for controlling the delay cell.

10. The locked loop circuit according to claim 9, further comprising a variable gain element for applying a variable gain to the saw-tooth signal, wherein the feedback circuitry is arranged to control the variable gain in dependence on the measured comparison signal.

11. The locked loop circuit according to claim 1, wherein the servo loop comprises a gating element for gating the comparison signal at a wrap point of the saw-tooth pattern.

12. The locked loop circuit according to claim 11, wherein the feedback circuitry further comprises:
   an integrator for integrating the gated comparison signal; and a comparator for comparing the integrated gated comparison signal with upper and lower thresholds, and increasing or decreasing the amplitude of the saw-tooth pattern in accordance with said comparison.

* * * * *

UNITED STATES PATENT AND TRADEMARK OFFICE
CERTIFICATE OF CORRECTION

| | | |
|---|---|---|
| PATENT NO. | : 8,773,181 B2 | Page 1 of 1 |
| APPLICATION NO. | : 13/691650 | |
| DATED | : July 8, 2014 | |
| INVENTOR(S) | : Mcleod et al. | |

It is certified that error appears in the above-identified patent and that said Letters Patent is hereby corrected as shown below:

In the Specification

In Column 2, Line 58, delete "sampling, point," and insert -- sampling point, --, therefor.

In Column 3, Line 21, delete "dr" and insert -- $\Delta\tau$ --, therefor.

Signed and Sealed this
Seventh Day of October, 2014

Michelle K. Lee
*Deputy Director of the United States Patent and Trademark Office*